US012777697B2

(12) United States Patent
Chang et al.

(10) Patent No.: US 12,777,697 B2
(45) Date of Patent: Oct. 27, 2026

(54) SEMICONDUCTOR TRANSISTOR DEVICE INCLUDING A PLURALITY OF DUMMY BODIES WITHIN METAL GATE STRUCTURE AND METHOD OF FABRICATING THE SAME

(71) Applicant: United Semiconductor (Xiamen) Co., Ltd., Xiamen (CN)

(72) Inventors: Wei-Chun Chang, Taichung City (TW); You-Di Jhang, New Taipei City (TW); Han-Min Huang, Shamen City (CN); Chin-Chun Huang, Hsinchu County (TW); Wen Yi Tan, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 429 days.

(21) Appl. No.: 18/370,392

(22) Filed: Sep. 19, 2023

(65) Prior Publication Data

US 2025/0072077 A1 Feb. 27, 2025

(30) Foreign Application Priority Data

Aug. 22, 2023 (CN) ......................... 202311058290.0

(51) Int. Cl.
*H10D 64/01* (2025.01)
*H10D 62/13* (2025.01)

(52) U.S. Cl.
CPC ......... *H10D 64/017* (2025.01); *H10D 62/151* (2025.01); *H10D 64/021* (2025.01)

(58) Field of Classification Search
CPC .. H10D 64/017; H10D 64/021; H10D 62/151; H10D 64/518; H10D 64/667
See application file for complete search history.

(56) References Cited

U.S. PATENT DOCUMENTS

| | | | | |
|---|---|---|---|---|
| 2012/0001259 A1* | 1/2012 | Chuang | H10D 84/0151 257/330 |
| 2012/0168869 A1* | 7/2012 | Hikida | H10D 30/603 257/E29.264 |
| 2017/0025531 A1* | 1/2017 | Chang | H10D 30/65 |
| 2018/0012970 A1* | 1/2018 | Kim | H10D 30/6893 |

* cited by examiner

*Primary Examiner* — Changhyun Yi
(74) *Attorney, Agent, or Firm* — Winston Hsu

(57) ABSTRACT

A semiconductor device and method of fabricating the same, the semiconductor device includes a substrate, a metal gate structure, at least one dummy body, two source/drain regions, and a dielectric layer. The metal gate structure is disposed on the substrate. The at least one dummy body is disposed within the metal gate structure. The source/drain regions are disposed at two sides of the metal gate structure respectively in the substrate. The dielectric layer is disposed on the substrate, around the metal gate structure.

19 Claims, 10 Drawing Sheets

SEMICONDUCTOR TRANSISTOR DEVICE INCLUDING A PLURALITY OF DUMMY BODIES WITHIN METAL GATE STRUCTURE AND METHOD OF FABRICATING THE SAME

BACKGROUND OF THE INVENTION

1. Field of the Invention

The present disclosure relates generally to a semiconductor device and a method of fabricating the same, and more particularly to a semiconductor device including a metal gate structure, and a method of fabricating the same.

2. Description of the Prior Art

According to the current semiconductor technology, polysilicon is conventionally used as a gate electrode in semiconductor devices, such as a metal-oxide-semiconductor (MOS) transistor. With the trend towards scaling down the size of the MOS transistor, however, conventional polysilicon gates face problems such as inferior performance due to boron penetration and unavoidable depletion effects. This increases equivalent thickness of the gate dielectric layer, reduces gate capacitance and worsens a driving force of the devices. Therefore, work function metals that are suitable for use as the high-k gate dielectric layer are used to replace the conventional poly-silicon gate to be the control electrode.

In addition, as the size of semiconductor components becomes smaller and smaller, there are many improvements in the process steps of forming transistors to fabricate transistors with small volume and high quality. However, as the size of devices continues to decrease, it becomes more difficult to dispose a high-voltage component with a larger line width and a low-voltage component with a minimized line width in the same semiconductor device together, and the processes of fabricating the semiconductor device also faces many limitations and challenges. Hence, how to resolve the issue in the fabrication for the high-voltage component has become an important task in this field.

SUMMARY OF THE INVENTION

An object of the present disclosure is to provide a semiconductor device and a method of fabricating the same, where at least one dummy body is disposed in the metal gate structure, to improve the structural reliability and the component performance of the metal gate structure, thereby avoiding the possible short circuit issue or structural defects caused by an under-grinding or an excessive grinding during a planarization process while carrying out a replacement metal gate (RMG) process.

To achieve the aforementioned object, the present disclosure provides a semiconductor device including a substrate, a metal gate structure, at least one dummy body, two source/drain regions and a dielectric layer. The metal gate structure is disposed on the substrate. The at least one dummy body is disposed within the metal gate structure. The source/drain regions are respectively disposed at two sides of the metal gate structure in the substrate. The dielectric layer is disposed on the substrate, around the metal gate structure.

To achieve the aforementioned object, the present disclosure provides a method of fabricating a semiconductor device including the following steps. A substrate is provided, and a metal gate structure is formed on the substrate. At least one dummy body is formed within the metal gate structure. Two source/drain regions are formed in the substrate, respectively at two sides of the metal gate structure. A dielectric layer is formed on the substrate, around the metal gate structure.

In summary, according to the semiconductor device and the fabricating method thereof, at least one dummy body is previously formed in the polysilicon gate structure, and a replacement of metal gate process is performed through the at least one dummy body, to avoid the possible short circuit issue or the structural defects of the metal gate structure caused by an under-grinding or an excessive grinding during the planarization process. Thus, the structural reliability and the component performance of the semiconductor device are both improved, to achieve a better operation.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 3 are schematic diagrams illustrating a semiconductor device according to a first embodiment of the present disclosure, in which:

FIG. 1 illustrating a cross-sectional view of a semiconductor device;

FIG. 2 illustrates a top view of a semiconductor device; and

FIG. 3 illustrates another top view of a semiconductor device.

FIG. 4 to FIG. 8 are schematic diagrams illustrating a method of fabricating a semiconductor device according to the first embodiment of the present disclosure, in which:

FIG. 4 is a schematic cross-sectional view of a semiconductor device after forming a polysilicon layer;

FIG. 5 is a schematic cross-sectional view of a semiconductor device after forming a polysilicon gate structure;

FIG. 6 is a schematic cross-sectional view of a semiconductor device after forming a dielectric layer;

FIG. 7 is a schematic cross-sectional view of a semiconductor device after removing the polysilicon layer; and FIG. 8 is a schematic cross-sectional view of a semiconductor device after forming a work function metal material layer and a conductive material layer.

FIG. 9 to FIG. 10 are schematic diagrams illustrating a semiconductor device according to a second embodiment of the present disclosure, in which:

FIG. 9 illustrates a cross-sectional view of a semiconductor device; and

FIG. 10 illustrates a top view of a semiconductor device.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
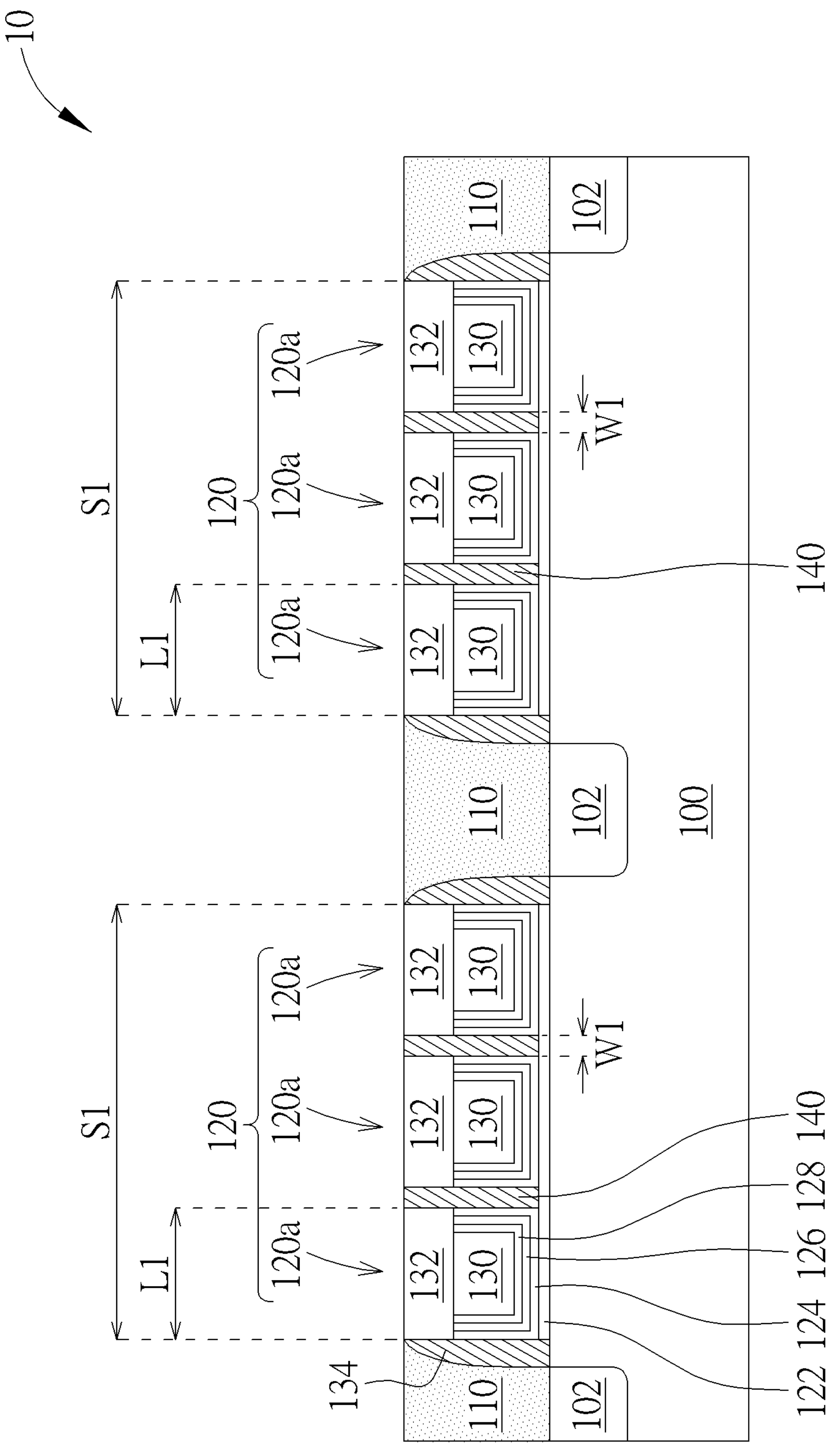
Figure 2:
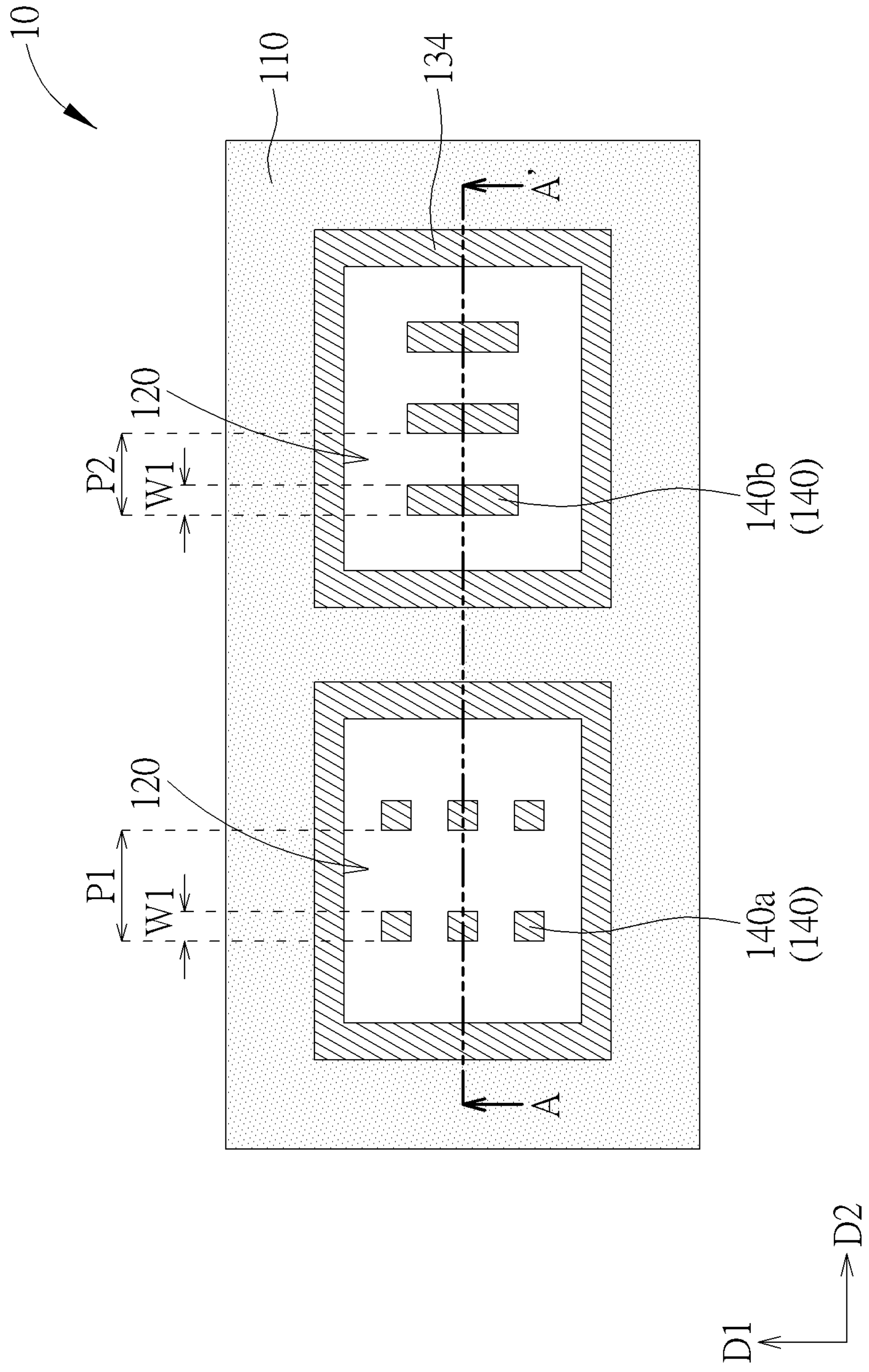
Figure 3:
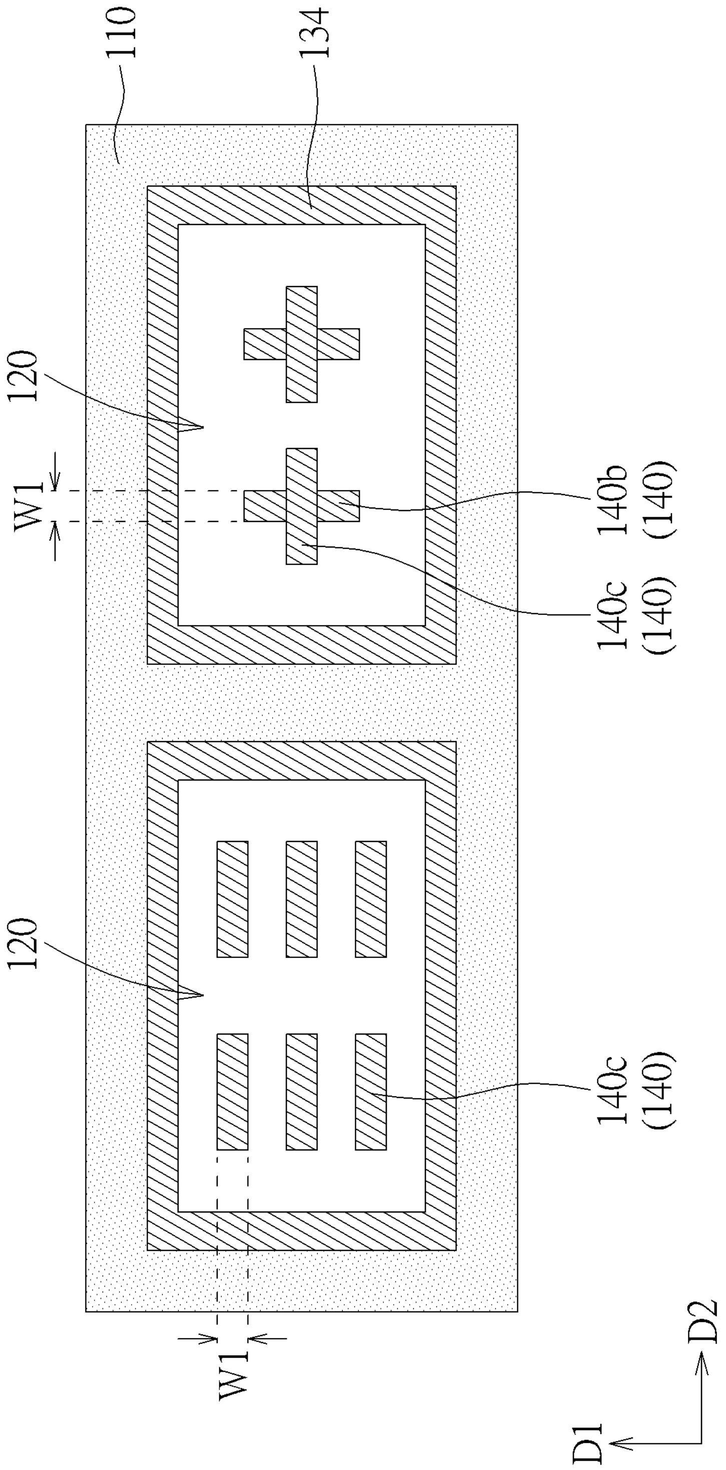

Please refer to FIG. 1 to FIG. 3, which illustrate a semiconductor device 10 according to a first embodiment of the present disclosure. As shown in FIG. 1, the semiconductor device 10 includes a substrate 100, a metal gate structure 120, at least one dummy body 140, two source/drain regions 102 and a dielectric layer 110. The substrate 100 for example includes a silicon substrate, an epitaxial silicon substrate, a silicon containing substrate or a silicon-on-insulator SOI substrate, but is not limited thereto. The metal gate structure 120 is disposed on the substrate 100, and the two source/drain regions 102 are disposed in the substrate 100, at two opposite sides of the metal gate structure 120. The dielectric layer 110 is disposed on the substrate 100, surrounding the metal gate structure 120 and entirely covering the substrate 100 and the source/drain regions 102. In one embodiment, each of the source/drain regions 102 for example includes a doped region including a suitable conductive type and a suitable dopant. For example, if the metal gate structure 120 is expected to form a P-type transistor (PMOS) in the subsequent manufacturing process, the doped region may include a P-type dopant such as boron, and if the metal gate structure 120 is expected to form an N-type transistor (NMOS) in the subsequent manufacturing process, the doped region may include an N-type dopant such as phosphorus, but is not limited thereto.

It is noted that the dummy body 140 is disposed in the metal gate structure 120, so that, the metal gate structure 120 having a relative larger line width S1 (for example, about 2 micrometers to 10 micrometers) will not leave unnecessary metal remained due to the under-grinding, and also will not generate structural defects like dishing metal gate due to the excessive grinding, during a planarization process such as a chemical mechanical polishing. Accordingly, the metal gate structure 120 of the semiconductor device 10 is allowable to gain a more reliable structure to effectively improve the device performance thereof.

In one embodiment the dummy body 140 for example includes an insulating material like silicon oxide, silicon nitride, silicon oxynitride or silicon carbonitride, but is not limited thereto. Also, a plurality of the dummy bodies 140 is disposed within the metal gate structure 120 of the semiconductor device 10, with each of the dummy bodies 140 separately disposed in the metal gate structure 120, to divide the metal gate structure 120 into a plurality of gate units 120*a*, as shown in FIG. 1. With these arrangements, the dummy bodies 140 and the gate units 120*a* are alternately arranged in a periodical order along a specific direction, wherein each of the gate unit 120*a* for example includes the same length L1 in the specific direction, and each of the dummy bodies 140 for example includes the same width W1 in the specific direction, but is not limited thereto. It is noted that, the arrangement of the dummy bodies 140 is tended to only cut off the extension length of the metal gate structure 120 in the specific direction (for example the line width S1 as shown in FIG. 1) without essentially reducing the line width S1 of the metal gate structure 120. Accordingly, the gate units 120*a* of the metal gate structure 120 are in connection with each other instead of being separated therefrom.

For example, as being viewed from a top view shown in FIG. 2, the dummy bodies 140 for example includes a plurality of square patterns 140*a* having the same shape and the same size (such as the same width W1), or includes a plurality of rectangular patterns 140*b* extending along the first direction D1. Each of the dummy bodies 140*a*, 140*b* are for example arranged along the first direction D1 and/or a vertical direction D2 perpendicular to the first direction D1 by the same pitch P1 or the same pitch P2, to present in a symmetric pattern as a whole, such as an array pattern as shown in the left of FIG. 2, but not limited thereto. People skilled in the art should fully realize that FIG. 1 may be a schematic cross-sectional view along the cross line A-A' in FIG. 2, and the aforementioned specific direction may be the vertical direction D2 as shown in FIG. 2, but is not limited thereto.

In addition, people skilled in the art can easily understand that the practical arranged number, the shape and the arranged pattern of the dummy bodies 140 are not limited to what is shown in FIG. 1 or FIG. 2, and those can be further adjusted based on practical product requirements. In another embodiment, the dummy bodies 140 may optionally include either a plurality of rectangular patterns 140*c* extending in the vertical direction D2, as shown in the left of FIG. 3, or a plurality of rectangular patterns 140*b* extending in the first direction D1 and a plurality of rectangular patterns 140*c* extending in the vertical direction D2 at the same time, with the rectangular patterns 140*b* and the rectangular patterns 140*c* overlapping with each other to form a plurality of cross patterns, as shown in the right of FIG. 3. The dummy bodies 140*b*, 140*c* each has the same size (for example the same width W1), and which are arranged in the first direction D1 and/or the vertical direction D2 by the same pitch (not shown in the drawing) to also present in a symmetrical pattern as a whole, but not limited thereto.

Precisely speaking, the metal gate structure 120 further includes a dielectric layer 122, an U-shaped high-k dielectric layer 124, an U-shaped work function metal layer 126, and an U-shaped barrier layer 128, a conductive layer 130, and a cover layer 132 stacked from bottom to top, and a spacer 134 disposed at sidewalls of the aforementioned stacked layers, as shown in FIG. 1, wherein the spacer 134 for example includes an insulating material like silicon oxide, silicon nitride, silicon oxynitride or silicon carbonitride, and preferably includes the same insulating material as the dummy bodies 140, but not limited thereto. In one embodiment, the high-k dielectric layer 124 for example includes a dielectric material having a dielectric constant greater than 4, such as hafnium oxide ($HfO_2$), the work function metal layer 126 for example includes a P-type work function metal layer including a nitride of nickel (Ni), tungsten (W), molybdenum (Mo), tantalum (Ta) or titanium (Ti), or a N-type work function metal layer including titanium aluminides (TiAL), aluminum zirconium (ZrAl), aluminum tungsten (WAl), aluminum tantalum (TaAl), or aluminum hafnium (HfAl), the barrier layer 128 for example includes titanium/titanium nitride (Ti/TiN) or tantalum/tantalum (Ta/TaN), and the conductive layer 130 for example includes a low-resistance metal material like titanium, tantalum, aluminum, copper or tungsten, but is not limited thereto.

According to the semiconductor device 10 of the present embodiment, the dummy bodies 140 are disposed in the metal gate structure 120, to dramatically improve the structural reliability and the component performance of the metal gate structure 120, thereby effectively avoiding the possible short circuit issue caused by remained metal due to the under-grinding, or avoiding the structural defects like dishing top surface of the metal gate due to the over-grinding during the planarization process in the replacement of metal gate process. In this way, the semiconductor device 10 of the present embodiment enables to gain a more reliable structure to achieve a better operation, such that, which can be further applied on a high-voltage component suitable for high-voltage operation, a medium-voltage component suitable for medium-voltage operation, or a component integrating the high-voltage component, the medium-voltage component and a low-voltage component for low-voltage operation, to prevent the metal gate structure 120 having the larger line width S1 from generating the structural defects or short circuit issue during performing the planarization process such as the chemical mechanical polishing accompany with the low-voltage component having a smaller line. The high-voltage component may refer to a semiconductor component with an initial voltage between 10 volts and 20 volts, the medium-voltage component may refer to a semiconductor component with an initial voltage between 5 volts and 10 volts, and the low-voltage component may refer to a semiconductor component with an initial voltage between 0.5 volt and 1 volt, but not limited thereto.

In order to make people skilled in the art of the present disclosure easily understand the semiconductor device 10 of the present disclosure, the fabricating method of the semiconductor device 10 in the present disclosure will be further described below.

Figure 4:
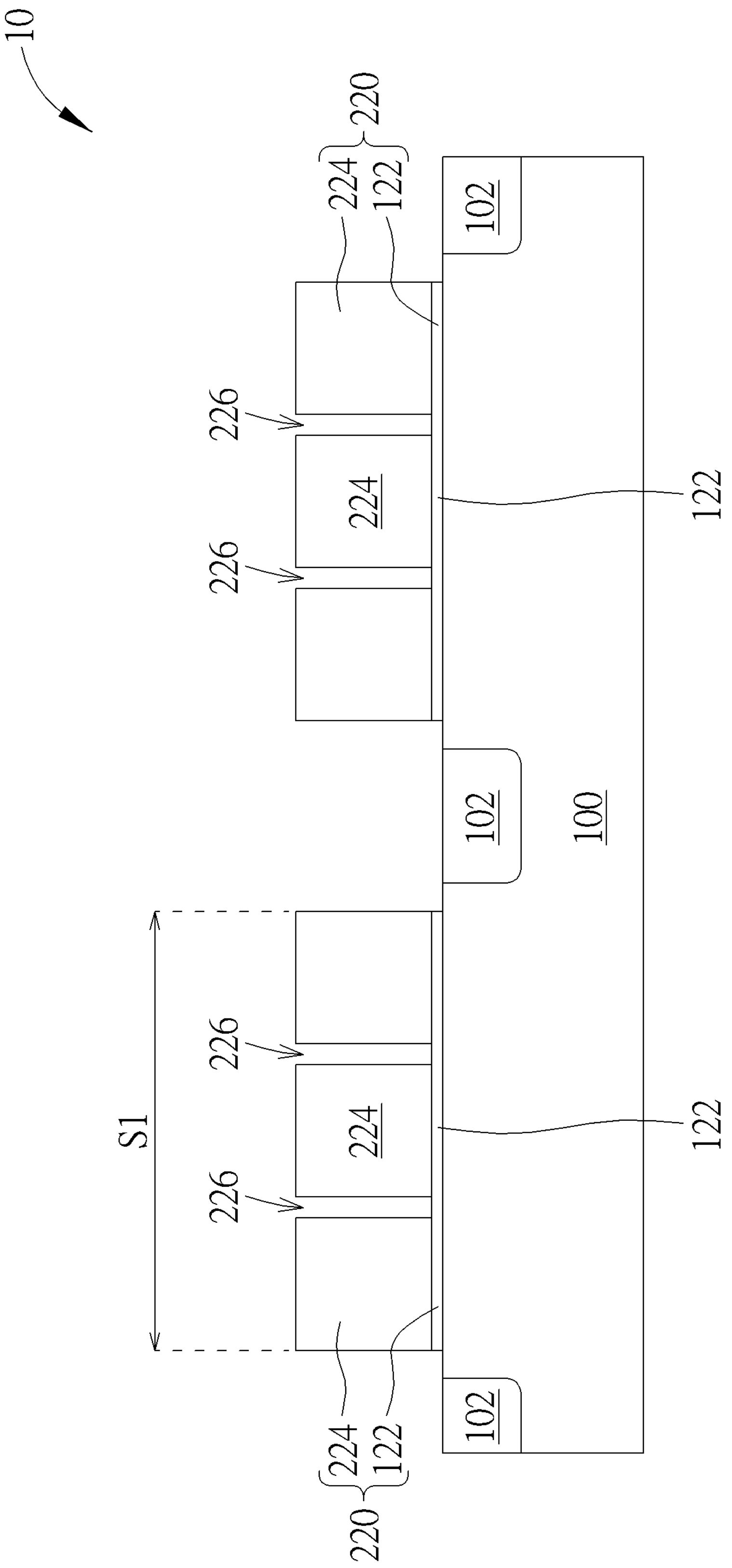
Figure 8:
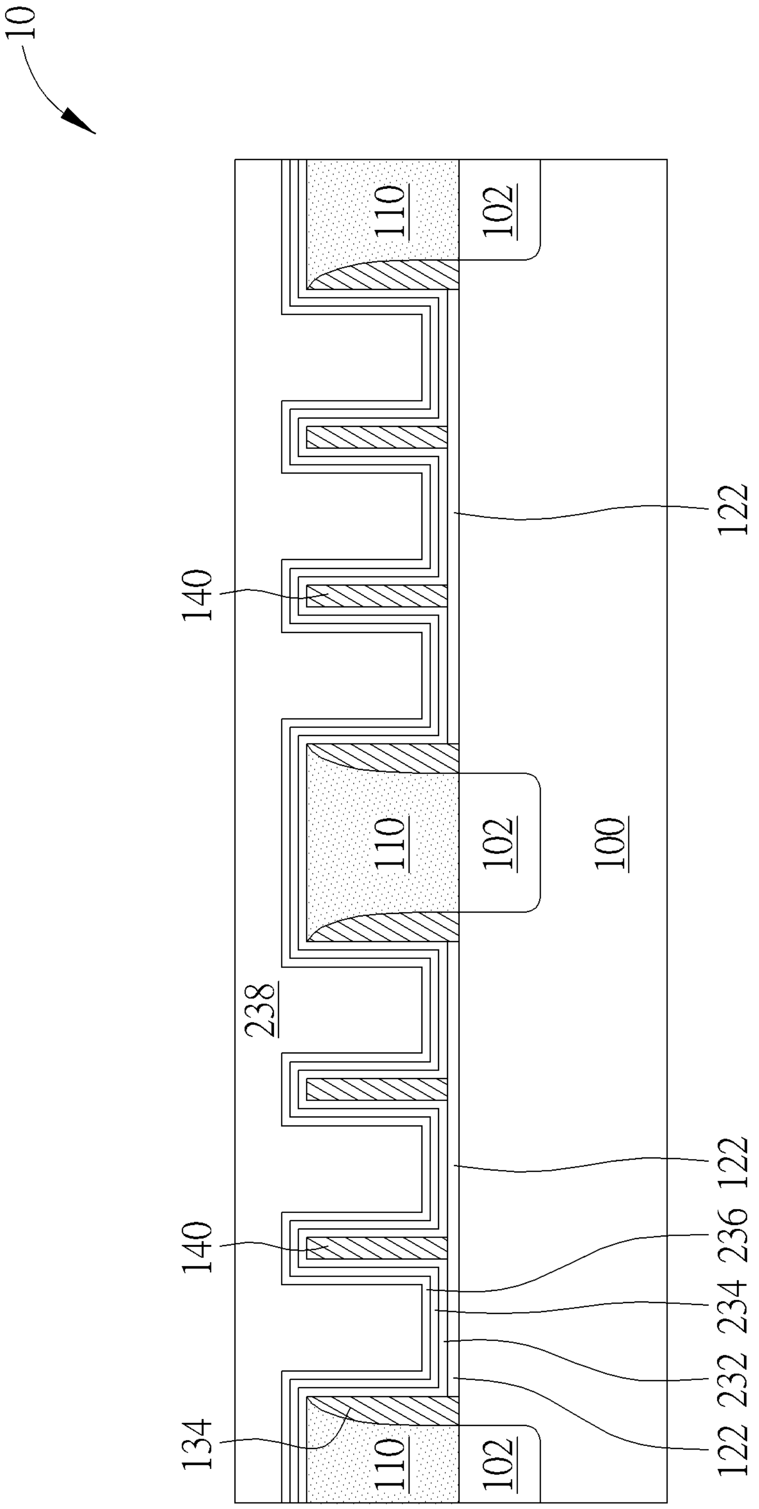

Please refer to FIG. 4 and FIG. 8, illustrating schematic diagrams of a fabricating method of the semiconductor device 10 according to the first embodiment in the present disclosure. Firstly, as shown in FIG. 4, the substrate 100 is provided, for example including a silicon substrate, an epitaxial silicon substrate, a silicon containing substrate or a silicon-on-insulator SOI substrate, and a polysilicon gate structure 220 is formed on the substrate 100. The polysilicon gate structure 220 further includes a dielectric layer 122 and a polysilicon layer 224 stacked sequentially, and a relative greater line width S1 for example being about 2 micrometers to 10 micrometers, but is not limited thereto. Also, at least one poly slot 226 is formed within the polysilicon layer 224. In one embodiment, the fabrications of the polysilicon gate structure 220 and the poly slot 226 include but are not limited to the following steps. Firstly, a dielectric material layer (not shown in the drawings) and a polysilicon material layer (not shown in the drawings) are sequentially formed on the substrate 100. Next, the dielectric material layer and the polysilicon material layer are patterned through a mask layer (not shown in the drawings), to form the dielectric layer 122 and the polysilicon layer 224, and also, the poly slot 226 is simultaneously formed in the poly silicon layer 224 through the mask layer while patterning the polysilicon material layer. Then, after removing the mask layer, an ion implantation mask (not shown in the drawings) is additionally formed on the substrate 100 to define a NMOS region or a PMOS region to be implanted. For example, a first ion implantation mask (not shown in the drawings) is formed to cover the NMOS region and to expose the PMOS region, or to cover the PMOS region and to expose the NMOS region, or to cover a low-voltage region and to expose a high-voltage region. It is noted that, the ion implantation mask will also cover each poly slot 226, and an ion implantation process is then performed through the first ion implantation mask, to form two doped regions in the substrate 100, at two sides of the polysilicon layer 224 thereby serving as the source/drain regions 102 of the semiconductor device 10.

Figure 5:
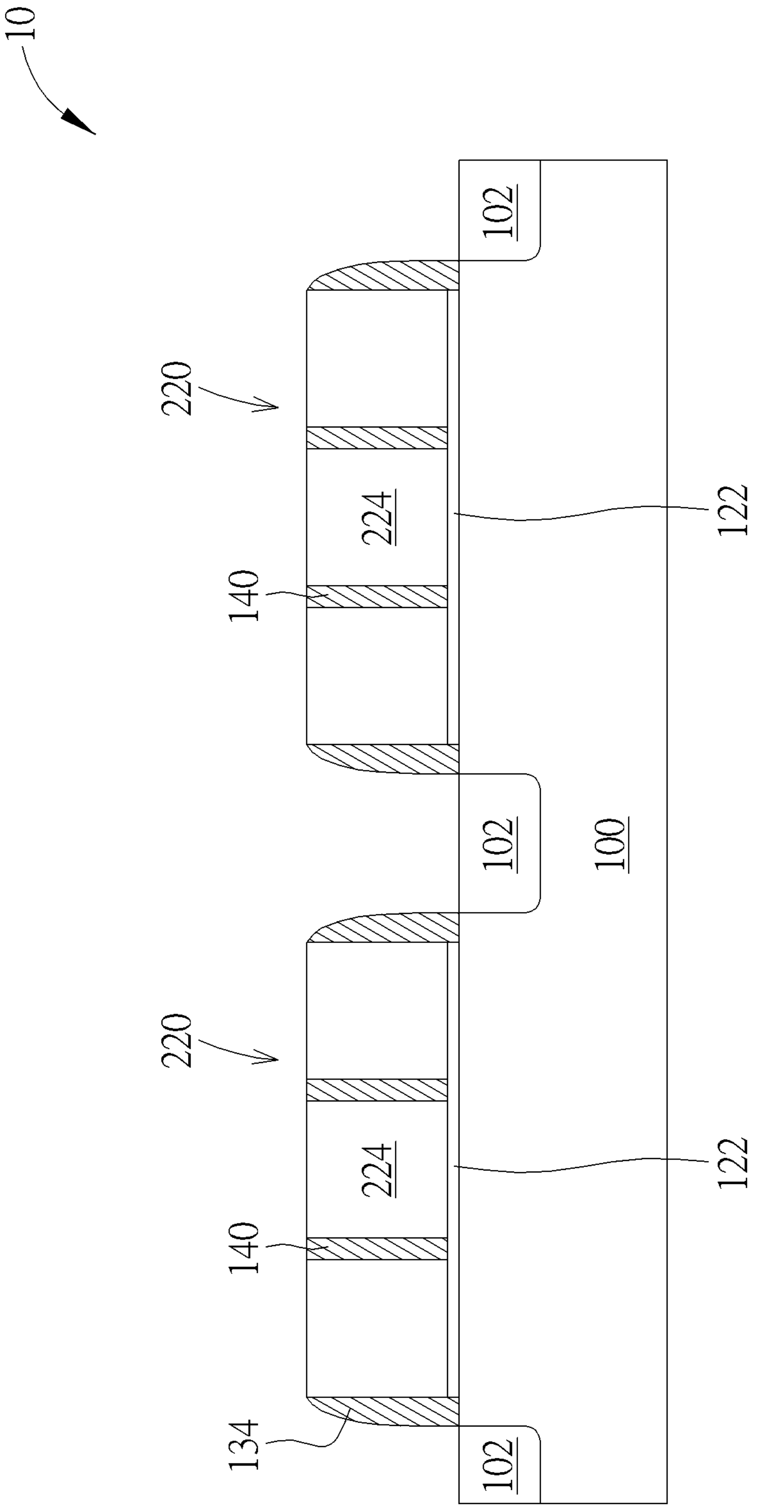

As shown in FIG. 5, the spacer 134 is formed on sidewalls of the polysilicon gate structure 220. In one embodiment, the fabrication of the spacer 134 includes but is not limited to sequentially perform a deposition process and an etching back process. Firstly, an insulating material layer is formed on the substrate 100 through the deposition process, to conformally cover on the polysilicon gate structure 220 and the substrate 100, wherein the insulating material layer for example includes an insulating material like silicon oxide, silicon nitride, silicon oxynitride or silicon carbonitride, but is not limited thereto. Then, the insulating material layer is partially removed through the etching back process, to form the spacer 134 on the sidewalls of the polysilicon gate structure 220. It is noted that, while performing the deposition process, the insulating material layer is formed to simultaneously fill in the poly slot 226 within the polysilicon layer 224, and the insulating material layer filled in the poly slot 226 will not be removed while performing the etching back process. Accordingly, the insulating material layer filled in the poly slot 226 will therefore form the at least one dummy body 140 after the etching back process. In other words, the dummy body 140 and the spacer 134 are simultaneous formed through the same deposition process and the etching back process, so as to obtain the same insulating material.

Figure 6:
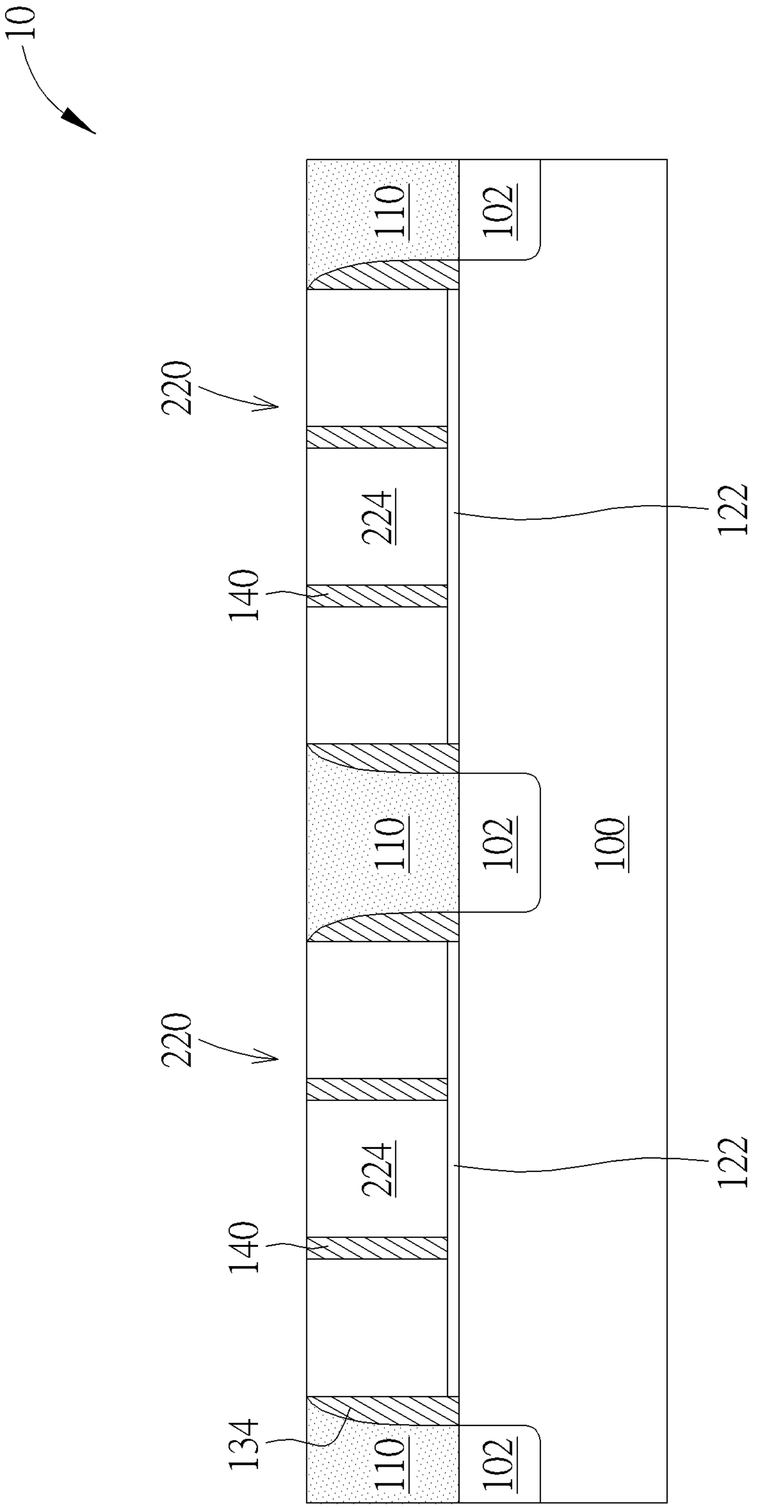

As shown in FIG. 6, a dielectric layer 110 is formed on the substrate 100, to cover the substrate 100 and to surround the polysilicon gate structure 220 and the spacer 134. In one embodiment, the fabrication of the dielectric layer 110 includes but is not limited to sequentially perform a deposition process and a planarization process. Firstly, through the deposition process, a dielectric material layer (not shown in the drawings) is formed on the substrate 100 to entirely cover the substrate 100 and the polysilicon gate structure 220, and then, the dielectric material layer is partially removed through the planarization process such as a chemical mechanical polishing, to expose the top surface of the polysilicon gate structure 220 to form the dielectric layer 110 serving as an interlayer dielectric layer. In one embodiment, the dielectric material layer for example includes a dielectric material layer such as silicon oxide or silicon oxynitride, and preferably includes a material having an etching selectivity related to the spacer 134 and the dummy body 140, but is not limited thereto.

Figure 7:
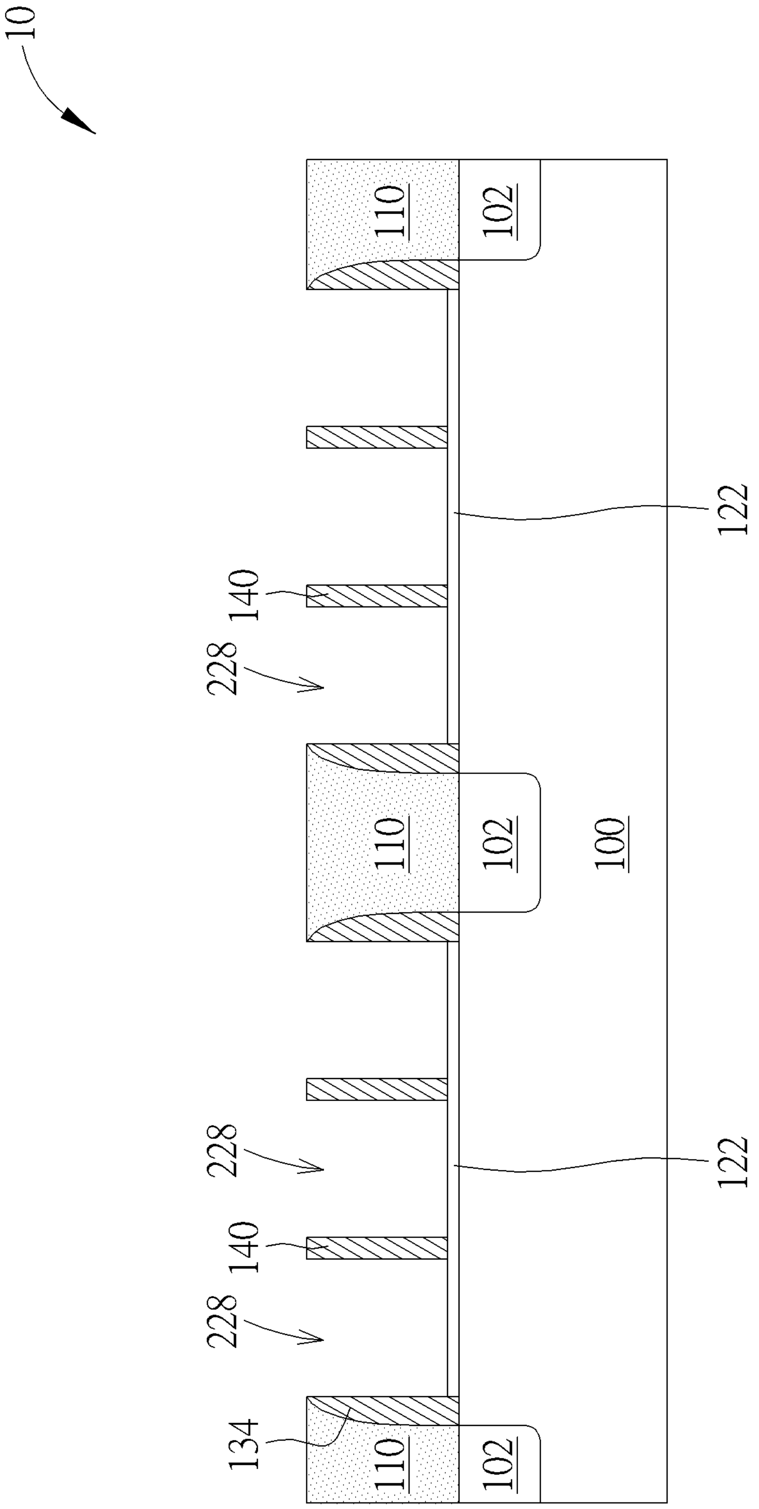

As shown in FIG. 7, a replacement of metal gate process is performed to completely remove the polysilicon layer 224 of the polysilicon gate structure 220, to form a gate trench 228 to expose the dielectric layer 122 underneath.

As shown in FIG. 8, plural deposition processes are performed to sequentially form a high-k dielectric material layer 232, a work function metal material layer 234, a barrier material layer 236, and a conductive material layer 238, wherein the high-k dielectric material layer 232, the work function metal material layer 234 and the barrier material layer 236 conformally covering the surfaces of the gate trench 228 and further covering the top surfaces of the dummy body 140 and the dielectric layer 110, and the conductive material layer 238 filled up the gate trench 228 and further covering the top surfaces of the dummy body 140 and the dielectric layer 110. After that, a planarization process such as a chemical mechanical polishing is performed through the dummy body 140 within the gate trench 228, to remove the conductive material layer 232, the barrier material layer 236, the work function metal material layer 234 and the high-k dielectric material layer 232 covering on the top surfaces of the dummy body 140 and the dielectric layer 110, and an etching back process is then performed to partially remove the conductive material layer 238, the barrier material layer 236, the work function metal material layer 234, and the high-k dielectric material layer 232 till being lower than the top surface of the dielectric layer 110, thereby forming the conductive layer 130, the barrier layer 128, the work function metal layer 126, and the high-k dielectric layer 124 as shown in FIG. 1. Finally, the cover layer 132 is formed. Accordingly, the cover layer 132, the conductive layer 130, the barrier layer 128, the work function metal layer 126, the high-k dielectric layer 124 and the dielectric layer 122 will together form the metal gate structure 120 as shown in FIG. 1, with the metal gate structure 120 having the relative greater line width S1.

Since the planarization process and the etching back process of the replacement of metal gate structure in the present embodiment is performed under previously forming the dummy body 140, the loading effect easily caused by various pattern densities will be effectively improved, thereby avoiding the possible defects such as dishing due to the over-grinding on the component with a relatively lower pattern density (namely, the metal gate structure 120 with the larger line width S1), or avoiding the possible issues such as the short circuit derived from the remained conductive material layer 228 due to the under-grinding.

According to the fabricating method of the semiconductor device 10 of the present embodiment, the poly slot 226 is formed in the polysilicon material layer 224 having the larger line width S1 during the polysilicon gate structure 220 is formed, and the dummy body 140 can be next formed in the poly slot 226 during the spacer 134 is formed in the subsequent process. Thus, the planarization process and the etching back process in the subsequent replacement of metal gate process may be carried out in the present of the dummy body 140, to effectively avoid the possible short circuit issue or the structural defect which may derive from the replacement of metal gate process, and to further improve the structural reliability and the device performance of the metal gate structure 120. In this way, the fabricating process of the present embodiment is allowable to be applied on a fabricating process for a high-voltage component, a fabricating process for a medium-voltage component, or a fabricating process for a component integrating the high-voltage component, the medium-voltage component, and the low-voltage component, to prevent the metal gate structure 120 having the larger line width S1 from generating the structural defects and the short circuit issue during performing the planarization process such as the chemical mechanical polishing in accompany with a low-voltage component having a smaller line (for example being less than 2 micrometers).

People skilled in the arts should easily realize the semiconductor device and the fabricating method thereof in the present disclosure is not limited to the aforementioned embodiment, and may further include other layouts. The following description will detail the different embodiments of the semiconductor device and the fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 9:
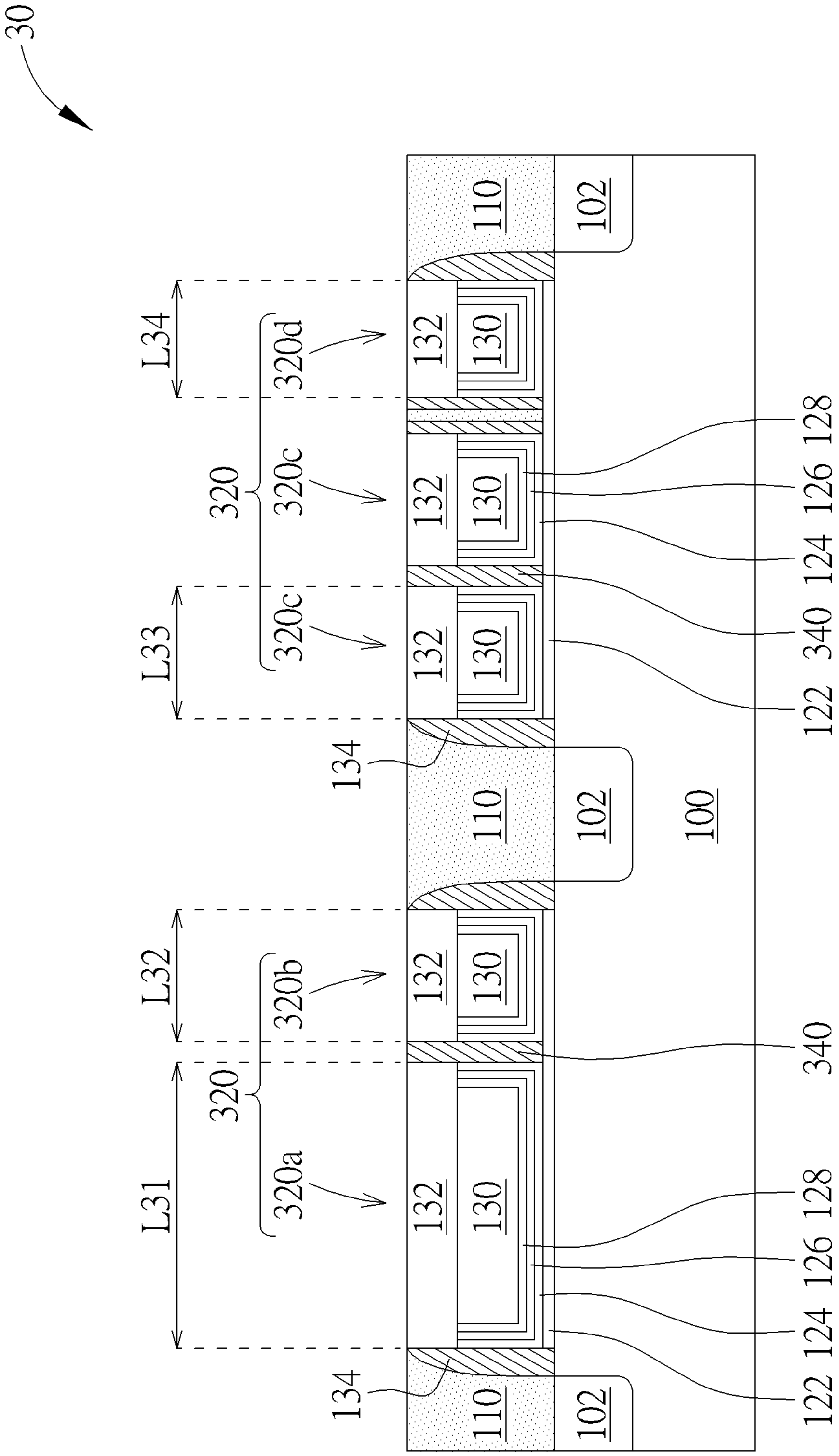
Figure 10:
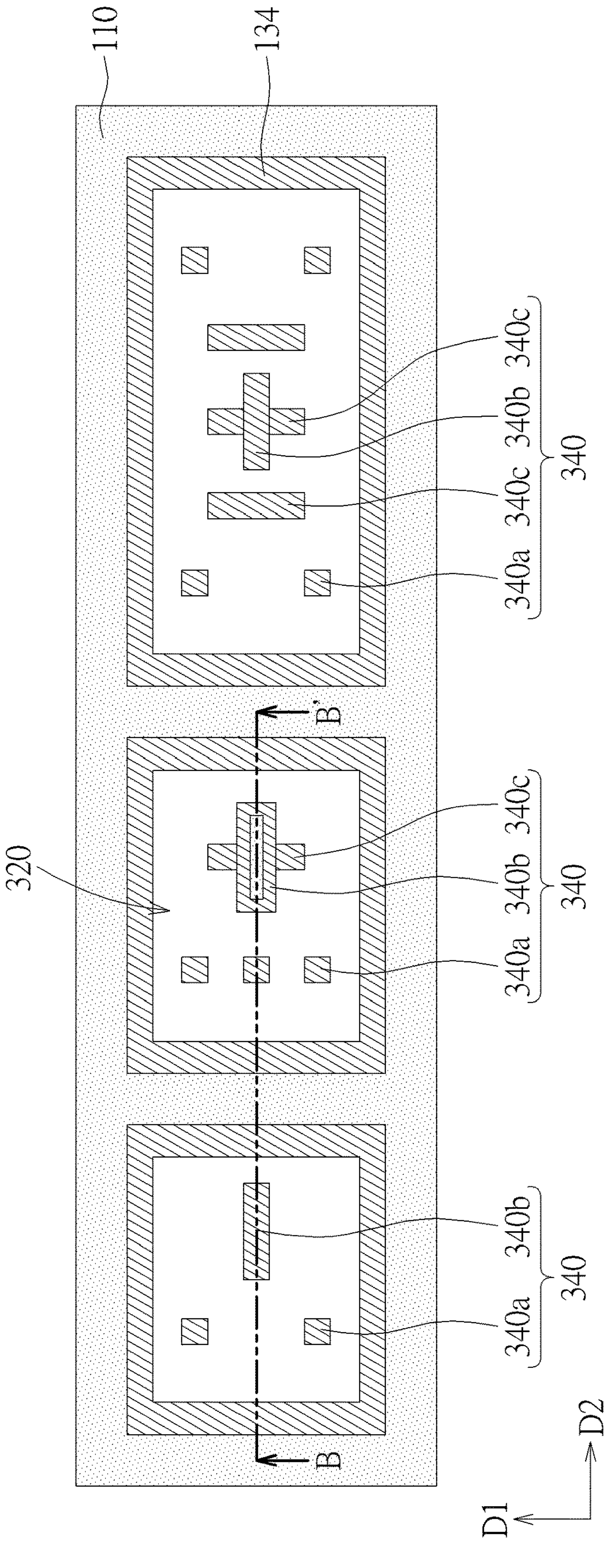

Please refer to FIG. 9 to FIG. 10, which illustrates a semiconductor device 30 according to a second embodiment of the present disclosure. The structure of the semiconductor device 30 of the present embodiment is substantially the same as that of the aforementioned first embodiment, and all the similarities of the two embodiments will not be redundantly described hereinafter. The difference between the present embodiment and the aforementioned first embodiment is mainly in that a dummy body 340 includes a multilayer structure and/or the metal gate structure 320 includes gate units in various lengths.

Precisely speaking, as shown in FIG. 9, a plurality of the dummy bodies 340 is formed in the metal gate structure 320, to divide the metal gate structure 320 into a plurality of the gate units 320*a*, 320*b* in different lengths L31, L32, or into a plurality of the gate units 320*c*, 320*d* in different lengths L33, L34, but not limited thereto, with each of the gate units 320*a*, 320*b* being connected with each other, or with each of the gate units 320*c*, 320*d* being connected with each other without being separately therefrom. For example, as shown in a top view shown in FIG. 10, the dummy bodies 340 for example includes a plurality of square patterns 340*a*, a plurality of rectangular patterns 340*b* extending along the first direction D1 and/or a plurality of rectangular patterns 340*c* extending along the vertical direction D2, but not limited thereto. The square patterns 340*a*, the rectangular patterns 340*b* and/or the rectangular patterns 340*c* are for example separately arranged from each other, or are intersected with each other to form a plurality of cross patterns, thereby presenting in an asymmetric pattern as a whole in the metal gate structure 320 as shown in FIG. 10, but not limited thereto. People skilled in the art should fully realize that FIG. 9 may be a schematic cross-sectional view along the cross line B-B' in FIG. 10, but is not limited thereto.

In other words, the dummy bodies 340 arranged in the metal gate structure 320 in the present embodiment may include plural patterns 340*a*, 340*b*, 340*c* respectively extending in different directions, respectively having different shapes, or respectively arranging by different pitches, to present in the asymmetric pattern. In this way, the arrangement of each dummy body 340 also enables to cut off the extension length of the metal gate structure 320 in the specific direction (for example the vertical direction D2 as shown in FIG. 10) without essentially reducing the line width S1 of the metal gate structure 320. Accordingly, the metal gate structure 320 will generate neither the possible issue like metal remained due to the under-grinding, nor the possible structural defects like dishing due to the over-grinding, so that, the metal gate structure 320 of the semiconductor device 30 is allowable to gain a more reliable structure to effective improve the function and the performance thereby.

On the other hand, in one embodiment, the dummy bodies 340 with various sizes (such as the various widths W1, W2) are alternatively arranged in the metal gate structure 320, wherein the dummy body 340 with the smaller size W1 includes a monolayer structure (having the material the same as that of the spacer 134), while the dummy body 340 with the larger size W2 includes a multilayer layer structure including an insulating layer 342 and an insulating layer 344, but is not limited thereto. The fabrication of the dummy bodies 340 includes but not limited to the following steps. Firstly, while forming the polysilicon gate structure 220 as shown in FIG. 4, a plurality of poly slots (not shown in the drawings) with various sizes (for example with the various widths W1, W2) are formed in the polysilicon layer 224 at the same time. Then, the insulating material layer is formed to fill up the poly slot with the width W1 to form the dummy body 340 with the width W1, and also, to fill in the poly slot with the width W2 to form a first portion (namely, the insulating layer 342) of the dummy body 340 with the width W2, during the spacer 134 as shown in FIG. 5 is formed. Then, the dielectric material layer is formed to fill up the poly slot with the width W2 to form the second portion (namely, the insulating layer 344) of the dummy body 340 with the width W2, during the dielectric layer 110 as shown in FIG. 6 is formed.

With these arrangements, the dummy bodies 340 with the various sizes (for example the various widths W1, W2) also enables to cut off the extension length of the metal gate structure 320 in the specific direction, such that, the metal gate structure 320 will generate neither the possible issue like metal remained due to the under-grinding, nor the possible structural defects like dishing due to the over-grinding, so that, the metal gate structure 320 of the semiconductor device 30 is allowable to gain a more reliable structure to effective improve the function and the performance thereby.

People skilled in the art should fully realize that, although the aforementioned embodiment is exemplified by arranging dummy bodies 340 in various sizes, in various shapes or in various pitches, the practical arrangements of the dummy bodies 340 are not limited thereto. In another embodiment, the arranged density, the gap size therebetween or the like of the dummy bodies 340 may also be further adjusted based on practical product requirements. For example, when a line width of a metal gate structure is larger than 10 micrometers or an area of the metal gate structure is further wider, the density of a plurality of dummy bodies arranged at a central portion of the metal gate structure is preferably higher than that of a plurality of dummy bodies arranged at a peripheral portion of the metal gate structure, but not limited thereto. In addition, the width of each dummy body 340 in the channel length of the metal gate structure 320 (for example, the length of the metal gate structure 320 between two source/drain regions 102) is preferably larger than the width of each dummy body 340 in the channel width of the metal gate structure 320 (for example, the width of the metal gate structure 320 in the direction perpendicular to the connecting line of the two source/drain regions 102) to gain a better channel width.

Overall speaking, according to the semiconductor device and the fabricating method thereof, at least one dummy body is previously formed in the polysilicon gate structure, and a replacement of metal gate process is performed through the at least one dummy bodies, to avoid the possible short circuit issue or the structural defects of the metal gate structure during the planarization process. Thus, the structural reliability and the component performance of the semiconductor device are both improved, to achieve a better operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
- a substrate;
- a metal gate structure, disposed on the substrate;
- at least one slot, disposed within the metal gate structure, wherein the at least one slot is around by the metal gate structure;
- at least one dummy body disposed in the at least one slot within the metal gate structure, wherein sidewalls of the at least one dummy body are all covered by the metal gate structure;
- two source/drain regions, respectively disposed in the substrate, at two sides of the metal gate structure; and
- a dielectric layer, disposed on the substrate, around the metal gate structure.

2. The semiconductor device according to claim 1, wherein the at least one dummy body comprises a multilayer structure.

3. The semiconductor device according to claim 1, further comprising a plurality of the dummy bodies separately arranged in the metal gate structure.

4. The semiconductor device according to claim 3, wherein the dummy bodies are arranged in an asymmetric pattern.

5. The semiconductor device according to claim 4, wherein the dummy bodies comprise a plurality of first dummy bodies and a plurality of second dummy bodies extending along different directions.

6. The semiconductor device according to claim 4, wherein the dummy bodies comprise a plurality of first dummy bodies and a plurality of second dummy bodies having different shapes.

7. The semiconductor device according to claim 4, wherein the dummy bodies are arranged by different pitches.

8. The semiconductor device according to claim 3, wherein the dummy bodies are arranged in a symmetric pattern.

9. The semiconductor device according to claim 8, wherein the dummy bodies are arranged in an array pattern.

10. The semiconductor device according to claim 8, wherein the dummy bodies are extended along a same direction.

11. The semiconductor device according to claim 8, wherein the dummy bodies are arranged by a same pitch.

12. The semiconductor device according to claim 3, wherein the metal gate structure further comprises a plurality of gate units, each of the gate units and each of the dummy bodies are alternately arranged in the metal gate structure.

13. The semiconductor device according to claim 12, wherein at least two of the gate units are in a same length.

14. The semiconductor device according to claim 12, wherein at least two of the gate units are in different lengths.

15. The semiconductor device according to claim 12, each of the gate units comprises an U-shaped high-k dielectric layer, an U-shaped work function metal layer, an U-shaped barrier layer and a metal layer stacked from bottom to top.

16. A method of fabricating a semiconductor device, comprising:
- providing a substrate;
- forming a metal gate structure on the substrate, which further comprising:
  - forming a polysilicon gate structure on the substrate;
  - forming at least one poly slot within the polysilicon gate structure;
  - forming the at least one dummy body filled in the at least one poly slot; and
  - after removing the polysilicon gate structure, forming the metal gate structure;
- forming at least one dummy body within the metal gate structure;
- forming two source/drain regions in the substrate, respectively at two sides of the metal gate structure; and
- forming a dielectric layer on the substrate, around the metal gate structure.

17. The semiconductor device according to claim 16, forming the at least one dummy body further comprising:
- forming a spacer on sidewalls of the polysilicon gate structure;
- forming the dielectric layer surrounding the polysilicon gate structure; and
- forming the at least one dummy body while forming the spacer.

18. The semiconductor device according to claim 16, forming the at least one dummy body further comprising:
- forming a spacer on sidewalls of the polysilicon gate structure;

forming the dielectric layer surrounding the polysilicon gate structure; and forming a portion of the at least one dummy body while forming the spacer, and forming another portion of the at least one dummy body while forming the dielectric layer.

19. The semiconductor device according to claim 16, forming the metal gate structure further comprising:

after removing a polysilicon layer of the polysilicon gate structure, sequentially forming a high-k dielectric material layer, a work function metal material layer, a barrier material layer, and a conductive material layer, covering the at least one dummy body;

performing a planarization process through the at least one dummy body; and forming the metal gate structure.

* * * * *